United States Patent
Park et al.

(10) Patent No.: US 9,595,620 B1
(45) Date of Patent: Mar. 14, 2017

(54) MOS VARACTORS AND SEMICONDUCTOR INTEGRATED DEVICES INCLUDING THE SAME

(71) Applicant: SK hynix Inc., Gyeonggi-do (KR)

(72) Inventors: Soon Yeol Park, Chungcheongbuk-do (KR); Sang Hyun Lee, Gyeonggi-do (KR)

(73) Assignee: SK Hynix Inc., Gyeonggi-do (KR)

(*) Notice: Subject to any disclaimer, the term of this patent is extended or adjusted under 35 U.S.C. 154(b) by 0 days.

(21) Appl. No.: 15/012,404

(22) Filed: Feb. 1, 2016

(30) Foreign Application Priority Data

Sep. 9, 2015 (KR) ........................ 10-2015-0127676

(51) Int. Cl.
| | |
|---|---|
| H01L 29/66 | (2006.01) |
| H01L 29/93 | (2006.01) |
| H01L 29/94 | (2006.01) |
| H01L 27/06 | (2006.01) |
| H01L 29/06 | (2006.01) |
| H01L 29/49 | (2006.01) |

(52) U.S. Cl.
CPC .......... *H01L 29/93* (2013.01); *H01L 27/0629* (2013.01); *H01L 27/0676* (2013.01); *H01L 29/0607* (2013.01); *H01L 29/0684* (2013.01); *H01L 29/4916* (2013.01); *H01L 29/94* (2013.01); *H01L 29/66174* (2013.01)

(58) Field of Classification Search
CPC . H01L 29/93; H01L 29/0607; H01L 29/0684; H01L 27/0629; H01L 27/0676; H01L 29/94; H01L 29/4916
See application file for complete search history.

(56) References Cited

U.S. PATENT DOCUMENTS

| | | | | |
|---|---|---|---|---|
| 6,100,770 | A * | 8/2000 | Litwin | ............... H01L 29/94 257/312 |
| 6,172,378 | B1 | 1/2001 | Hull et al. | |
| 9,236,466 | B1 * | 1/2016 | Lee | ............... H01L 29/105 |
| 2004/0201052 | A1 * | 10/2004 | Nakashiba | ........ H01L 27/0629 257/296 |
| 2008/0149983 | A1 * | 6/2008 | Rassel | ............... H01L 29/93 257/312 |
| 2013/0260486 | A1 * | 10/2013 | Huang | ........... H01L 29/66174 438/18 |
| 2015/0162323 | A1 * | 6/2015 | Taya | ............... H01L 27/0629 257/296 |

* cited by examiner

*Primary Examiner* — Jarrett Stark
(74) *Attorney, Agent, or Firm* — IP & T Group LLP

(57) ABSTRACT

A MOS varactor includes a first N-type junction region and a second N-type junction region spaced apart from each other by a channel region, a gate insulation layer disposed on the channel region, a gate electrode disposed on the gate insulation layer, and an N-type well region including the channel region and surrounding the first and second N-type junction regions. The N-type well region exhibits a maximum impurity concentration in the channel region.

3 Claims, 8 Drawing Sheets

MOS VARACTORS AND SEMICONDUCTOR INTEGRATED DEVICES INCLUDING THE SAME

CROSS-REFERENCE TO RELATED APPLICATIONS

The present application claims priority under 35 U.S.C 119(a) to Korean Patent Application No. 10-2015-0127676, filed on Sep. 9, 2015, in the Korean Intellectual Property Office, which is incorporated herein by reference in its entirety as set forth in full.

BACKGROUND

1. Technical Field

Various embodiments of the present disclosure relate generally to semiconductor devices and, more particularly, to varactors and semiconductor integrated devices including the same.

2. Related Art

Capacitors have been employed in various integrated circuits, and varactors have been used in some application areas of electronic circuits. A varactor, which is also referred to as a variable capacitor, may exhibit tunable capacitance values. For example, a capacitance value of the varactor may be controlled or varied by changing a voltage applied between both terminals of the varactor. A varactor may be used in analog circuits or digital circuits for tuning parameters of other circuits.

A varactor may be realized to have a metal-oxide-semiconductor (MOS) structure or a PN junction structure. A varactor having a MOS structure (hereinafter referred to as a MOS varactor) has the advantage of being compatible with MOS fabrication processes. For example, a MOS varactor may be formed using the same process as used in fabrication of metal-oxide-semiconductor field effect transistors (MOSFETs) even without additional unit processes. Moreover, it is well known in the art that generally a MOS varactor has a wider tuning range and a higher quality (Q) factor as compared with a varactor having a PN junction structure.

SUMMARY

Various embodiments are directed to MOS varactors and semiconductor integrated devices including the same.

According to one embodiment, a MOS varactor includes a first N-type junction region and a second N-type junction region spaced apart from each other by a channel region, a gate insulation layer disposed on the channel region, a gate electrode disposed on the gate insulation layer, and an N-type well region including the channel region and surrounding the first and second N-type junction regions. The N-type well region exhibits a maximum impurity concentration in the channel region.

According to another embodiment, a MOS varactor includes a first N-type junction region and a second N-type junction region spaced apart from each other by a channel region, a gate insulation layer disposed on the channel region, a gate electrode disposed on the gate insulation layer, a first N-type well region including the channel region and surrounding the first and second N-type junction regions, and a second N-type well region and a third N-type well region disposed in the first N-type well region to include the channel region.

According to another embodiment, a semiconductor integrated device includes a P-type semiconductor region, a lateral double diffused MOS (LDMOS) transistor, and a MOS varactor. The LDMOS transistor includes an N-type source region and an N-type drain region disposed in an upper region of a first region of the P-type semiconductor region, a first N-type drift region and a second drift region disposed in an upper region of the P-type semiconductor region to surround the N-type drain region, and a P-type well region disposed in an upper region of the P-type semiconductor region to surround the N-type source region. A first gate insulation layer is disposed on the P-type well region, the P-type semiconductor region and the second drift region. A first gate electrode is disposed on the first gate insulation layer. The MOS varactor includes a first N-type junction region and a second N-type junction region disposed in an upper region of a second region of the P-type semiconductor region to be spaced apart from each other by a channel region, an N-type well region disposed in an upper region of the P-type semiconductor region to include the channel region and to surround the first and second N-type junction regions, a second gate insulation layer disposed on the channel region, and a second gate electrode disposed on the second gate insulation layer. The N-type well region exhibits a maximum impurity concentration in the channel region.

According to another embodiment, a semiconductor integrated device includes a P-type semiconductor region, a zener diode, and a MOS varactor. The zener diode includes a first P-type contact region and an N-type contact region disposed in an upper region of a first region of the P-type semiconductor region to be spaced apart from each other, an N-type buried layer disposed under the P-type semiconductor region, an N-type deep well region disposed in the P-type semiconductor region on the N-type buried layer, an N-type sink region disposed between the first P-type contact region and the N-type buried layer, and an N-type junction region disposed in the P-type semiconductor region to contact the N-type deep well region and to surround the N-type contact region. The MOS varactor includes a first N-type junction region and a second N-type junction region disposed in an upper region of a second region of the P-type semiconductor region to be spaced apart from each other by a channel region, an N-type well region disposed in an upper region of the P-type semiconductor region to include the channel region and to surround the first and second N-type junction regions, a gate insulation layer disposed on the channel region, and a gate electrode disposed on the gate insulation layer. The N-type well region exhibits a maximum impurity concentration in the channel region.

BRIEF DESCRIPTION OF THE DRAWINGS

Various embodiments of the present disclosure will become more apparent to those skilled in the art to which this invention pertains in view of the attached drawings and accompanying detailed description, in which.

DETAILED DESCRIPTION OF THE EMBODIMENTS

In general, a MOS varactor may be fabricated to have a wide tuning range. The tuning range of the MOS varactor may be defined as a ratio of a maximum capacitance value (Cmax) of the MOS varactor to a minimum capacitance value (Cmin) of the MOS varactor. However, in some application areas, the MOS varactor having a relatively narrow tuning range may be required. In various embodiments of the present disclosure, an impurity concentration of an N-type well region may be appropriately controlled to reduce the tuning range of a MOS varactor employing the N-type well region as a bulk region of the MOS varactor.

It will be understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present disclosure.

It will also be understood that when an element is referred to as being located "on," "over," "above," "under," "beneath," "below," "side," or "aside" another element, it may directly contact the other element, or at least one intervening element may be present therebetween. Accordingly, the terms such as "on," "over," "above," "under," "beneath," "below," "side," "aside," and the like that are used herein are for the purpose of describing only a position relationship of two elements and are not intended to limit the scope of the present disclosure.

It will be further understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Figure 1:
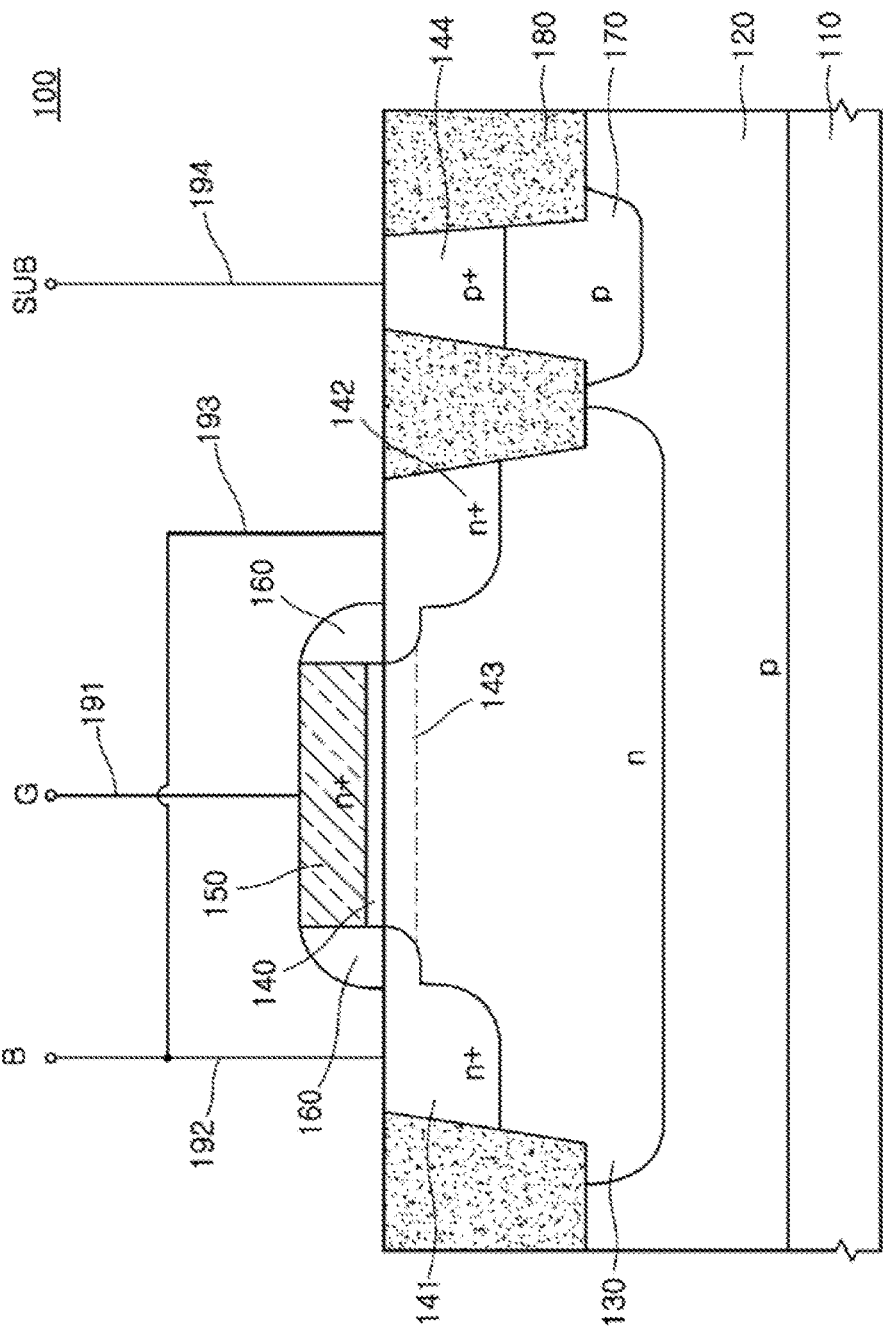
FIG. 1 is a cross-sectional view illustrating a MOS varactor, according to an embodiment of the present disclosure.

Referring now to FIG. 1, a cross-sectional illustration of a MOS varactor 100 is provided, according to an embodiment of the invention. The MOS varactor 100 may include a well region 130 with a first conductivity, for example, an N-type well region. A first junction region 141 with the first conductivity and a second junction region 142 with the first conductivity, for example, a first N-type junction region 141 and a second N-type junction region 142 may be disposed in an upper region of the N-type well region 130. First and second junction regions may be spaced apart from each other. An impurity concentration of each of the first and second N-type junction regions 141 and 142 may be higher than a maximum value of an impurity concentration of the N-type well region 130. In an embodiment, each of the first and second N-type junction regions 141 and 142 may have a lightly doped drain (LDD) structure. An upper region of the N-type well region 130 between the first and second N-type junction regions 141 and 142 may be defined as a channel region 143. A gate insulation layer 140 may be disposed on the channel region 143. In an embodiment, the gate insulation layer 140 may include an oxide layer. A gate electrode 150 may be disposed on the gate insulation layer 140. In an embodiment, the gate electrode 150 may include a polysilicon layer doped with N-type impurities. Gate spacers 160 may be disposed on both sidewalls of the gate electrode 150, respectively. In an embodiment, each of the gate spacers 160 may include an oxide layer or a nitride layer.

The N-type well region 130 may be disposed in an upper region of a P-type semiconductor region 120. In an embodiment, the P-type semiconductor region 120 may be an epitaxial layer. Alternatively, the P-type semiconductor region 120 may be a junction region. The P-type semiconductor region 120 may be disposed on a substrate 110. The substrate 110 may have a P-type conductivity. A P-type well region 170 may be disposed in an upper region of the P-type semiconductor region 120. The P-type well region 170 may be spaced apart from the N-type well region 130. A trench isolation layer 180 may be disposed between the N-type well region 130 and the P-type well region 170. A P-type contact region 144 may be disposed in an upper region of the P-type well region 170.

The gate electrode 150 may be electrically connected to a gate terminal G through a first interconnection line 191. The first and second N-type junction regions 141 and 142 may be electrically connected to a bulk terminal B through a second and a third interconnection lines 192, 193, respectively. The P-type contact region 144 may be electrically connected to a substrate terminal SUB through a fourth interconnection line 194.

Figure 2:
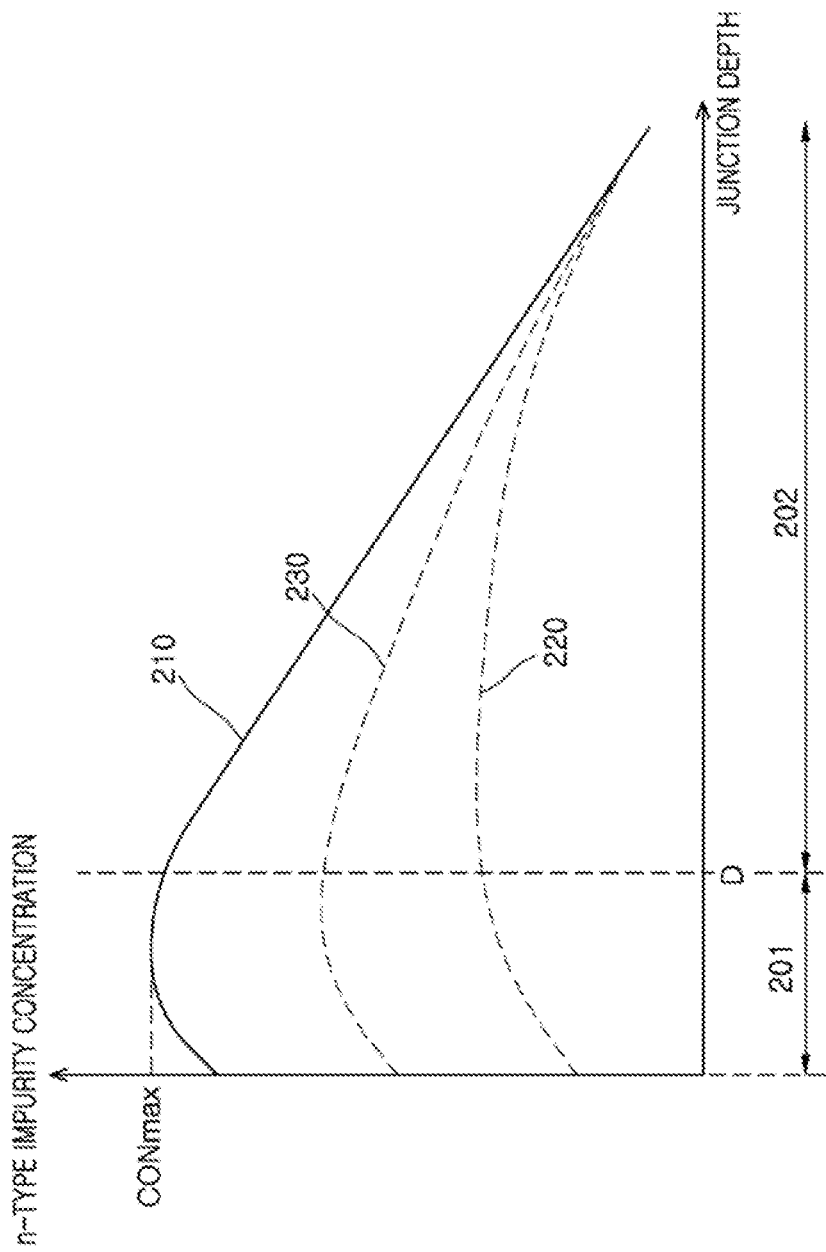
FIG. 2 is a graph illustrating an impurity concentration profile of an N-type well region of a MOS varactor, according to an embodiment of the present disclosure.

FIG. 2 is a graph illustrating an impurity concentration profile of an N-type well region of a MOS varactor, according to an embodiment of the present disclosure. For example, an impurity concentration profile of the N-type well region 130 of the MOS varactor 100 in FIG. 1 may be illustrated. In the graph of FIG. 2, the abscissa (or horizontal axis) represents a junction depth of the N-type well region 130 and the ordinate (or vertical axis) represents an impurity concentration of the N-type well region 130.

Referring to FIGS. 1 and 2, the N-type well region 130 may be divided into a first region 201 distributed from a top surface of the N-type well region 130 to a position having a first depth D and a second region 202 distributed from the position having the first depth D to a bottom surface of the N-type well region 130. The first depth D may correspond to the thickness of the channel region 143 of FIG. 1. For example, the position having the first depth D may correspond to a position at which a bottom surface of the channel region 143 is located. The impurity concentration of the N-type well region 130 may gradually increase as the junction depth of the N-type well region 130 increases from the top surface of the N-type well region 130 and may have a maximum concentration CONmax at a certain position in the N-type well region 130 which is shallower than the first depth D. In addition, the impurity concentration of the N-type well region 130 may gradually decrease as the junction depth of the N-type well region 130 increases from the position having the maximum concentration CONmax to a position having the first depth D. Moreover, the impurity concentration of the N-type well region 130 may gradually decrease as the junction depth of the N-type well region 130 increases in the second region 202. For example, the N-type well region 130 may have a graded impurity concentration profile meaning that the impurity concentration of the N-type well region 130 gradually decreases as the junction depth of the N-type well region 130 increases from the position having the maximum concentration CONmax to the bottom surface of the N-type well region 130.

The concentration profile of the N-type well region 130 may be obtained by performing an ion implantation process at least three times. In FIG. 2, a curve indicated by a reference numeral 220 denotes an impurity concentration profile of the N-type well region 130 formed by performing the ion implantation process once. In such a case, a variation of the impurity concentration of the N-type well region 130 may be relatively small, and a maximum impurity concentration of the N-type well region 130 may also be relatively low. A curve indicated by a reference numeral 230 denotes an impurity concentration profile of the N-type well region 130 formed by performing the ion implantation process twice. In such a case, a variation of the impurity concentration of the N-type well region 130 formed by performing the ion implantation process twice may be relatively large as compared with the N-type well region 130 exhibiting the impurity concentration profile of curve 220. Also, a maximum impurity concentration of the N-type well region 130 formed by performing the ion implantation process twice may also be relatively high as compared with the N-type well region 130 exhibiting the impurity concentration profile of curve 220. However, the variation of the impurity concentration of the N-type well region 130 formed by performing the ion implantation process twice may be relatively small as compared with the N-type well region 130 exhibiting an impurity concentration profile plotted by a curve 210, and a maximum impurity concentration of the N-type well region 130 formed by performing the ion implantation process twice may also be relatively low as compared with the N-type well region 130 exhibiting the impurity concentration profile plotted by the curve 210. The N-type well region 130 exhibiting the impurity concentration profile 210 may be obtained by performing the ion implantation process at least three times.

In an embodiment, an implantation process used in formation of the N-type well region 130 may include a first ion implantation process, a second ion implantation process and a third ion implantation process. The first ion implantation process may correspond to an ion implantation process for forming a general N-type well region. The N-type well region 130 formed using the first ion implantation process may exhibit the impurity concentration profile 220. The second ion implantation process may be different from the first ion implantation process for forming the general N-type well region. In an embodiment, the second ion implantation process may be an ion implantation process for forming an N-type drift region. The second ion implantation process may be used in formation of a single drift region or a plurality of N-type drift regions. After the first and second ion implantation processes are performed, the N-type well region 130 may exhibit the impurity concentration profile 230. The third ion implantation process may also be different from the first ion implantation process for forming the general N-type well region. In an embodiment, the third ion implantation process may be an implantation process for forming an N-type sink region. After the first, second and third ion implantation processes are performed, the N-type well region 130 may exhibit the impurity concentration profile 210. The sequence that the first to third ion implantation processes are performed may differ. An impurity dose added to the N-type well region with the second ion implantation process may be lower than that added with the first ion implantation process. An impurity dose added to the N-type well region with the third ion implantation process may be higher than the impurity doses added with the first and second ion implantation processes. In an embodiment, the impurity dose added to the N-type well region with the second implantation process may be higher than the impurity amount added with the first implantation process and the impurity dose added with the third implantation process may be higher than that added with the first implantation process.

Figure 3:
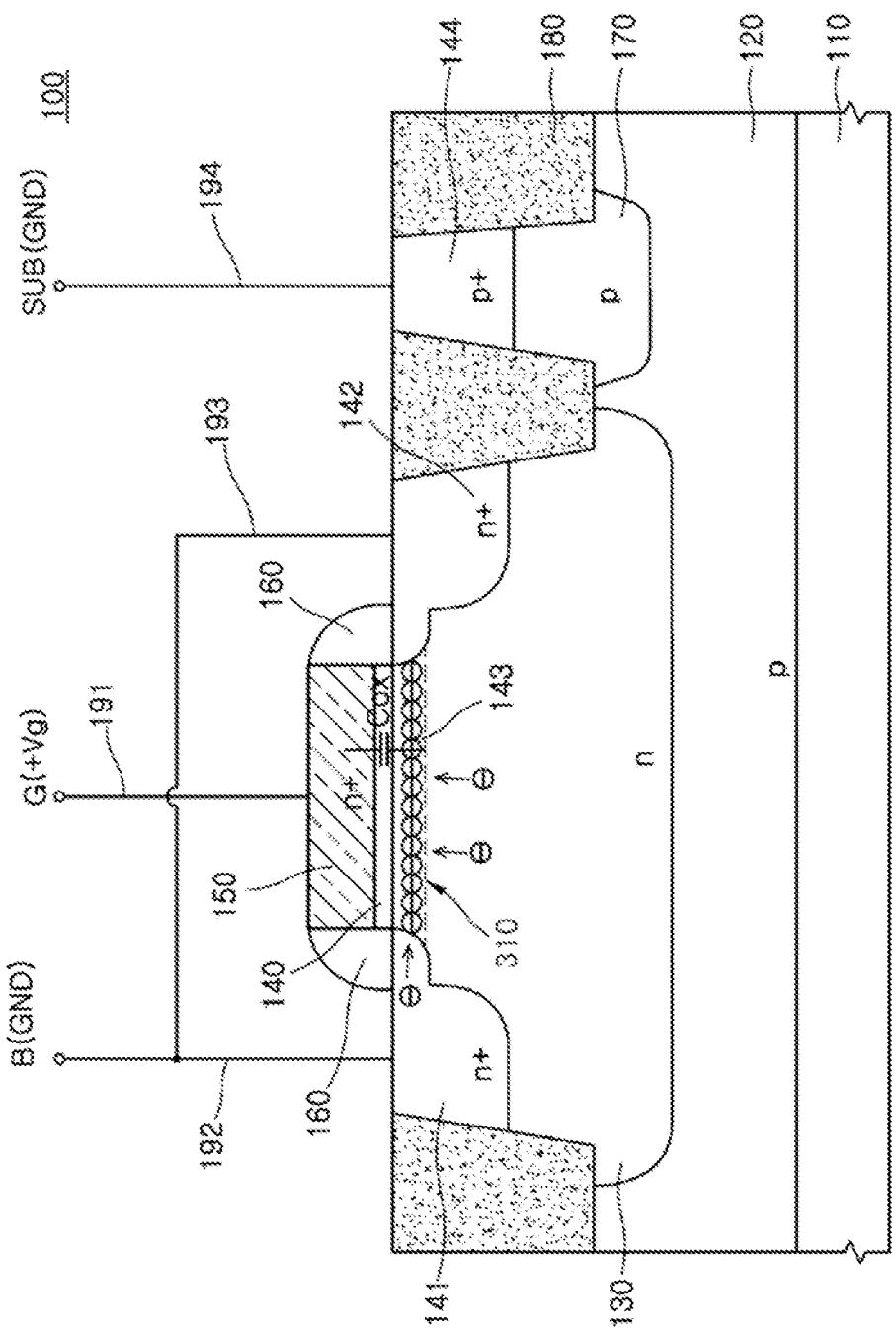
FIG. 3 is a cross-sectional view illustrating a strong accumulation mode operation of a MOS varactor, according to an embodiment of the present disclosure.
Figure 4:
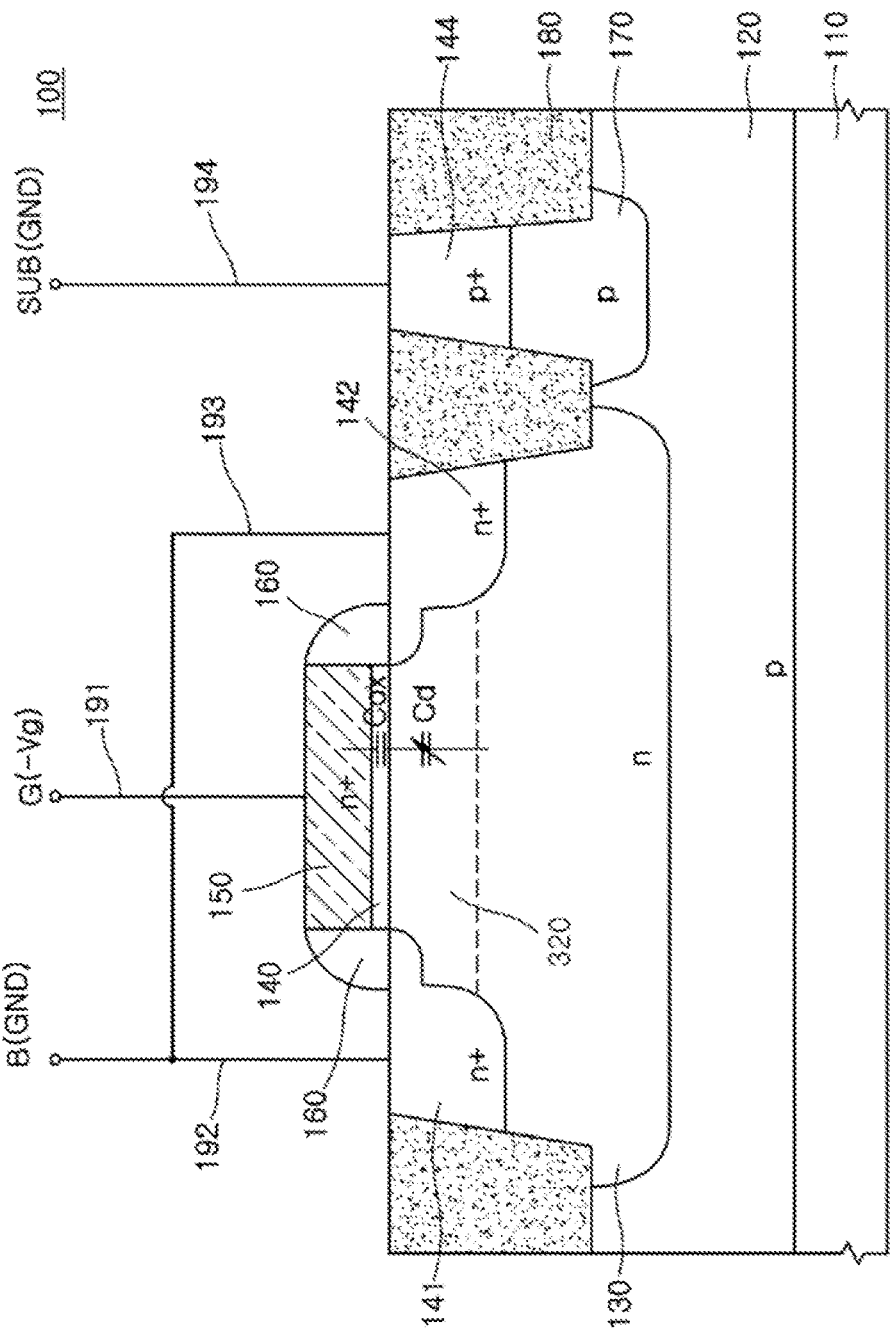
FIG. 4 is a cross-sectional view illustrating a strong depletion mode operation of a MOS varactor, according to an embodiment of the present disclosure.

FIGS. 3 and 4 are cross-sectional views illustrating operations of a MOS varactor according to an embodiment of the present disclosure. For example, the operations of FIGS. 3 and 4 may be operations of the MOS varactor 100 of FIG. 1 in a strong accumulation mode and a strong depletion mode, respectively. In FIGS. 3 and 4, the same reference numerals used as in FIG. 1 may denote the same elements.

Referring to FIG. 3, a positive gate voltage +Vg may be applied to the gate terminal G, and a ground voltage GND may be applied to the bulk and the substrate terminals B and SUB. Since the gate electrode 150 is doped with impurities having the same conductivity as the N-type well region 130, a flat band voltage VFB of a MOS structure including the gate electrode 150, the gate insulation layer 140 and the N-type well region 130 may be close to a zero voltage. Thus, if the positive gate voltage +Vg is applied to the gate terminal G and the bulk terminal B is grounded, the MOS varactor 100 may operate in a strong accumulation mode. For example, electrons are introduced into the channel region 143 from the N-type well region 130 and the first and second N-type junction regions 141 and 142. As a result, the electrons introduced into the channel region 143 may form an accumulation layer 310. The accumulation layer 310 may function as a lower electrode of the MOS varactor 100. If the number of the electrons introduced into the channel region 143 reaches a maximum value, the MOS varactor 100 may exhibit a maximum capacitance value. In this strong accumulation mode, the maximum capacitance value of the MOS varactor 100 may correspond to a gate insulation capacitance value Cox which is determined by the gate insulation layer 140 only.

Referring to FIG. 4, a negative gate voltage −Vg may be applied to the gate terminal G, and the ground voltage GND may be applied to the bulk terminal B and the substrate terminal SUB. Under the above bias condition, the MOS varactor 100 may operate in a strong depletion mode. For example, a depletion layer 320 may be formed in the N-type well region 130 between the first and second N-type junction regions 141 and 142. When the depletion layer 320 obtains a maximum depletion width, the MOS varactor 100 exhibits a minimum capacitance value. Hence, in this strong depletion mode, the minimum capacitance value of the MOS varactor 100 may depend on the gate insulation layer 140 and the depletion layer 320. For example, the minimum capacitance value of the MOS varactor 100 may be determined by a capacitance value Cox of the gate insulation layer 140 and a capacitance value Cd of the depletion layer 320. Accordingly, by changing the gate voltage applied to the gate electrode 150 from a positive gate voltage +Vg to a negative gate voltage −Vg, the capacitance value of the MOS varactor 100 may be changed from a maximum capacitance value to a minimum capacitance value.

Figure 5:
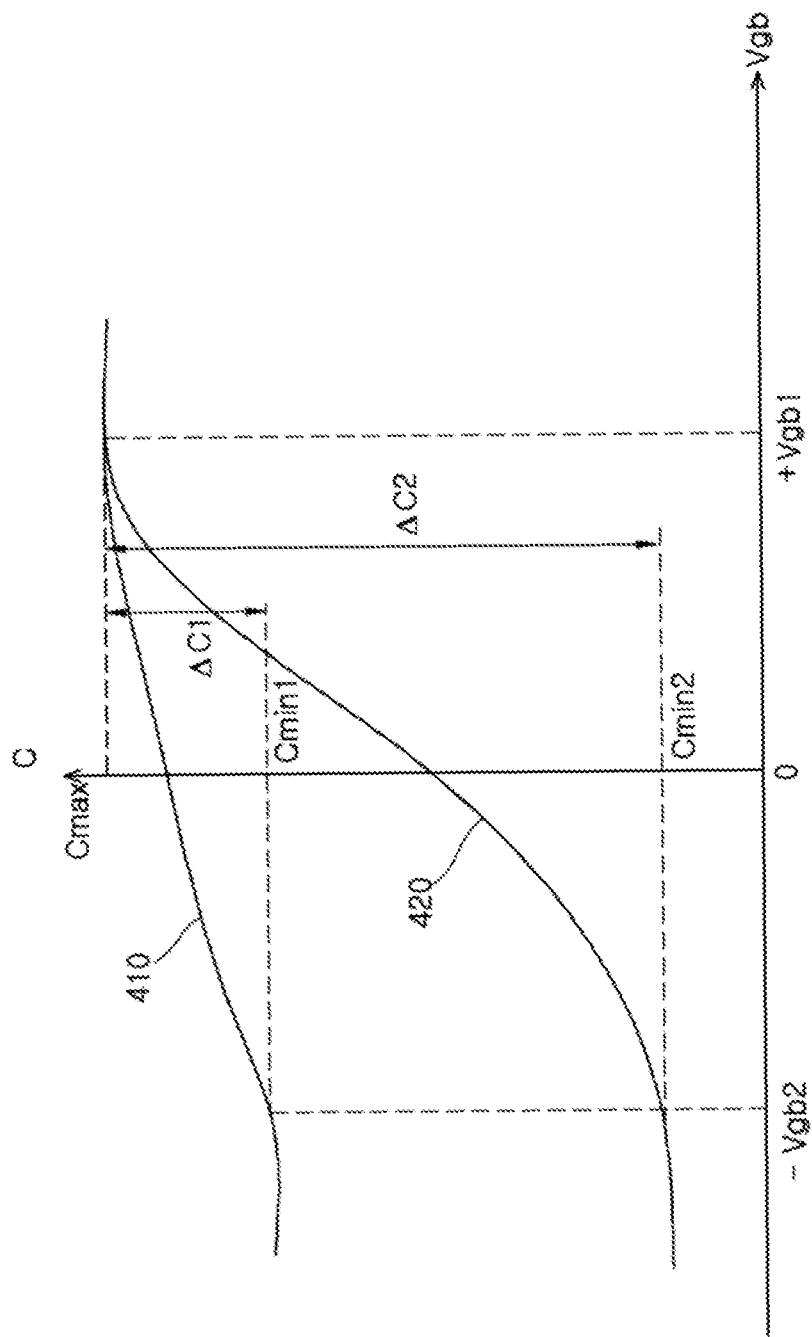
FIG. 5 is a graph illustrating a C-V plot of a MOS varactor, according to an embodiment of the present disclosure.

FIG. 5 is a graph illustrating a C-V plot of a MOS varactor according to an embodiment of the present disclosure. For example, the MOS varactor of FIG. 5 may be the MOS varactor 100 of FIG. 1. The C-V plot of the MOS varactor 100 of FIG. 5 is compared with a C-V plot of a general MOS varactor.

In the graph of FIG. 5, the abscissa represents a gate voltage Vgb between the gate terminal G and the bulk terminal B of the MOS varactor 100, and the ordinate represents a capacitance value C of the MOS varactor 100 and the general MOS varactor. The curve indicated by reference numeral 410 denotes a C-V characteristic of the MOS varactor 100, and the curve indicated by a reference numeral 420 denotes a C-V characteristic of the general MOS varactor. Tuning ranges of the MOS varactor 100 and the general MOS varactor may be obtained from the graph of FIG. 5. The general MOS of FIG. 5 has an N-type well region with a uniform impurity concentration profile. Hence, the general MOS varactor may be different from the MOS varactor 100 in terms of the impurity concentration profile of the N-type well region. The general MOS varactor may exhibit a maximum capacitance value Cmax when a first gate voltage +Vgb1 is applied between the gate terminal G and the bulk terminal B, and the capacitance value C of the general MOS varactor may decrease as the gate voltage Vgb is lowered. Subsequently, if a second gate voltage −Vgb2 is applied between the gate terminal G and the bulk terminal B, the general MOS varactor may exhibit a minimum capacitance value Cmin2. Accordingly, the tuning range of the general MOS varactor may depend on a capacitance difference ΔC2 between the maximum capacitance value Cmax and the minimum capacitance value Cmin2. Meanwhile, the MOS varactor 100 described with reference to FIGS. 1 to 4 may exhibit the same maximum capacitance value Cmax as the general MOS varactor. However, when the second gate voltage −Vgb2 is applied between the gate terminal G and the bulk terminal B, the MOS varactor 100 may exhibit a minimum capacitance value Cmin1 which is higher than the minimum capacitance value Cmin2 of the general MOS varactor. The tuning range of the MOS varactor 100 may depend on a capacitance difference & C1 between the maximum capacitance value Cmax and the minimum capacitance value Cmin1. Thus, the tuning range of the MOS varactor 100 may be less than the tuning range of the general MOS varactor. The reason that the capacitance difference ΔC1 is less than the capacitance difference ΔC2 is because the impurity concentration of an upper region (i.e., the channel region 143) of the N-type well region 130 is higher than the impurity concentrations of other regions in the N-type well region 130. That is, the reason that the capacitance difference ΔC1 is less than the capacitance difference ΔC2 is because the impurity concentration of an upper region (i.e., the channel region 143) of the N-type well region 130 is higher than the impurity concentration of an upper region (acting as a channel region) of an N-type well region included in the general MOS varactor. As a result, the MOS varactor 100 may exhibit a tuning range which is less than that of the general MOS varactor by designing the N-type well region 130 so that the impurity concentration of the channel region 143 in the N-type well region 130 has a maximum impurity concentration.

Figure 6:
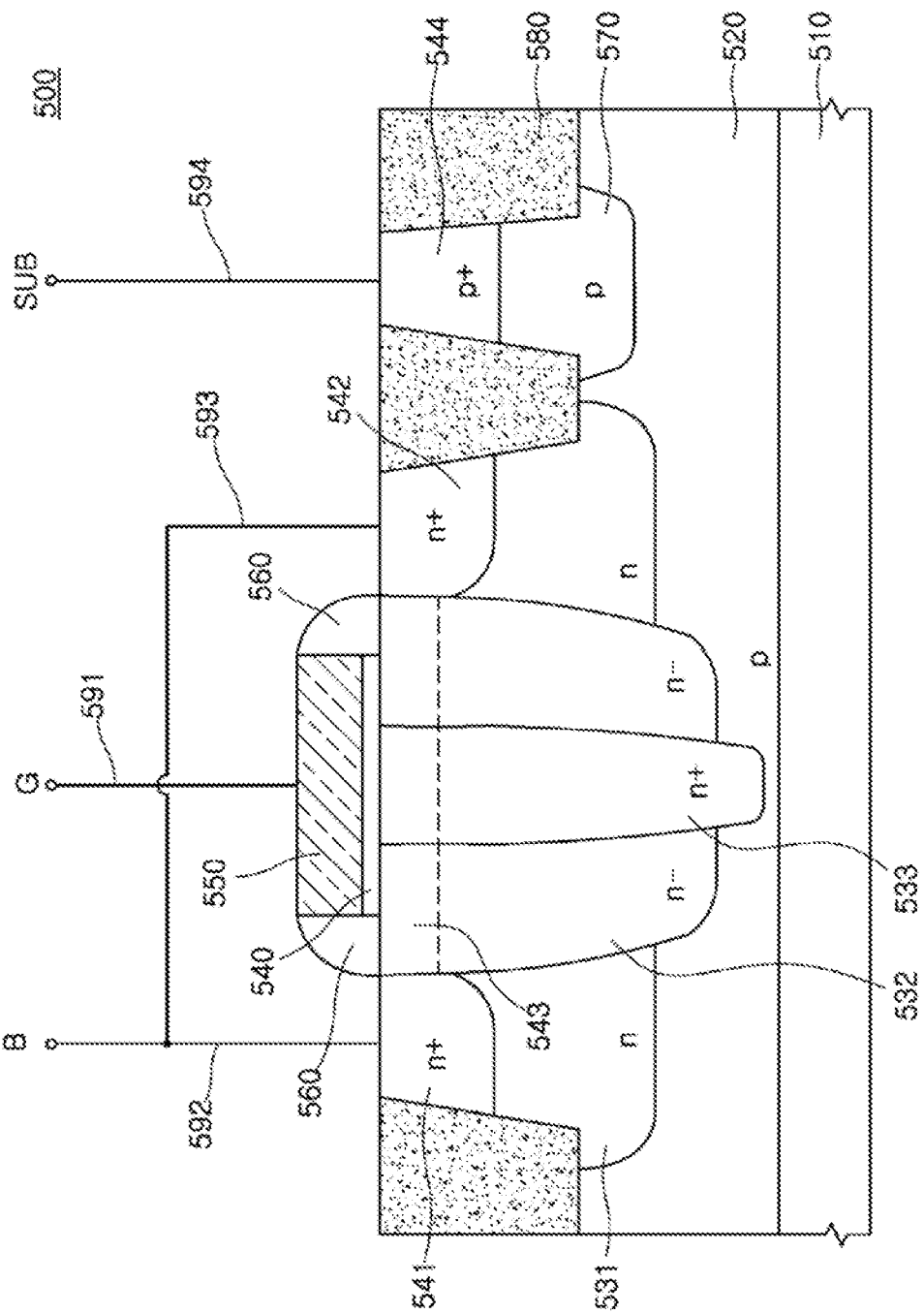
FIG. 6 is a cross-sectional view illustrating a MOS varactor, according to another embodiment of the present disclosure.

FIG. 6 is a cross-sectional view illustrating a MOS varactor 500 according to another embodiment of the present disclosure. Referring to FIG. 6, the MOS varactor 500 may include a first N-type well region 531, a second N-type well region 532 and a third N-type well region 533. The first, second and third N-type well regions 531, 532 and 533 may be disposed in an upper region of a P-type semiconductor region 520. In an embodiment, the P-type semiconductor region 520 may be an epitaxial layer. Alternatively, the P-type semiconductor region 520 may be a junction region. The P-type semiconductor region 520 may be disposed on a substrate 510. The substrate 510 may have a P-type conductivity. A P-type well region 570 may be disposed in an upper region of the P-type semiconductor region 520. The P-type well region 570 may be spaced apart from the first N-type well region 531. A trench isolation layer 580 may be disposed between the first N-type well region 531 and the P-type well region 570.

The second N-type well region 532 may be disposed to overlap with a portion of the first N-type well region 531. The third N-type well region 533 may be disposed to overlap with a portion of the second N-type well region 532. A width of the second N-type well region 532 may be less than a width of the first N-type well region 531. Thus, sidewalls of the second N-type well region 532 may be surrounded at least partially by the first N-type well region 531. A junction depth of the second N-type well region 532 may be greater than a junction depth of the first N-type well region 531. Accordingly, a lower portion of the second N-type well region 532 may protrude from a bottom surface of the first N-type well region 531 into the P-type semiconductor region 520. A width of the third N-type well region 533 may be less than a width of the second N-type well region 532. Thus, sidewalls of the third N-type well region 533 may be surrounded at least partially by the second N-type well region 532. A junction depth of the third N-type well region 533 may be greater than a junction depth of the second N-type well region 532. Accordingly, a lower portion of the third N-type well region 533 may protrude from a bottom surface of the second N-type well region 532 into the P-type semiconductor region 520.

A first and a second N-type junction regions 541, 542 may be disposed in an upper region of the first N-type well region 531 and spaced apart from each other by a channel region 543. A sidewall of the first N-type junction region 541 may be in contact with an upper portion of a sidewall of the second N-type well region 532. A sidewall of the second N-type junction region 542 may be in contact with an upper portion of a sidewall of the second N-type well region 532 opposite to the first N-type junction region 541. An impurity concentration of each of the first and second N-type junction regions 541 and 542 may be higher than impurity concentrations of the first, second and third N-type well regions 531, 532 and 533.

In an embodiment, an impurity concentration of the first N-type well region 531 may be higher than an impurity concentration of the second N-type well region 532, and an impurity concentration of the third N-type well region 533 may be higher than an impurity concentration of the first N-type well region 531. Thus, an impurity concentration of the channel region 543 in the third N-type well region 533 may be higher than an impurity concentration of the channel region 543 in the second N-type well region 532. First to third ion implantation processes for forming the first, second and third N-type well regions 531, 532 and 533 may be performed so that projection ranges (Rp) of the first to third ion implantation processes are located in the channel region 543. In such a case, even after a well drive-in process is performed to diffuse and activate impurity ions, a well region including the diffused and activated impurity ions may exhibit a maximum concentration in the channel region 543 and an impurity concentration of the well region may gradually decrease from the channel region 543 toward the P-type semiconductor region 520.

A gate insulation layer 540 may be disposed on the channel region 543 between the first and second N-type junction regions 541 and 542. In an embodiment, the gate insulation layer 540 may include an oxide layer. A gate electrode 550 may be disposed on the gate insulation layer

540. In an embodiment, the gate electrode 550 may include a polysilicon layer doped with N-type impurities. Gate spacers 560 may be disposed on both sidewalls of the gate electrode 550, respectively. In an embodiment, each of the gate spacers 560 may include an oxide layer or a nitride layer.

A P-type contact region 544 may be disposed in an upper region of the P-type well region 570. The gate electrode 550 may be electrically connected to a gate terminal G through a first interconnection line 591. The first and second N-type junction regions 541 and 542 may be electrically connected to a bulk terminal B through a second interconnection line 592 and a third interconnection line 593, respectively. The P-type contact region 544 may be electrically connected to a substrate terminal SUB through a fourth interconnection line 594.

An operation of the MOS varactor 500 may be the same as the operation of the MOS varactor 100 described with reference to FIGS. 3 and 4. The MOS varactor 500 may exhibit a C-V plot which is similar to the curve 410 illustrated in FIG. 5. For example, the MOS varactor 500 may exhibit a tuning range which is less than that of the general MOS varactor by designing an N-type well region including the first to third N-type well regions 531, 532 and 533 so that the N-type well region exhibits a maximum impurity concentration in the channel region 543.

Figure 7:
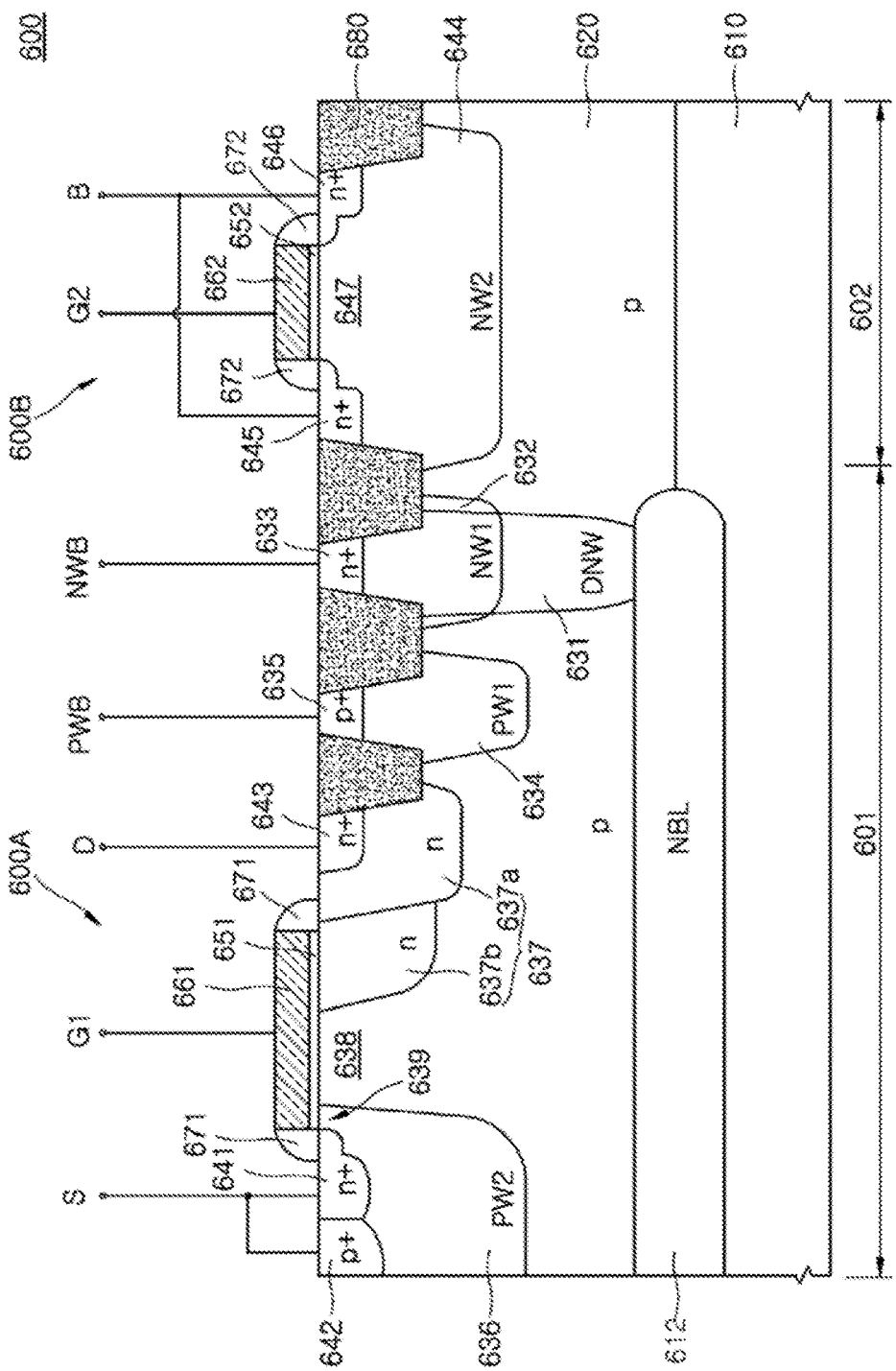
FIG. 7 is a cross-sectional view illustrating a semiconductor integrated device including a MOS varactor, according to an embodiment of the present disclosure.

FIG. 7 is a cross-sectional view illustrating a semiconductor integrated device 600 including a MOS varactor 600B, according to an embodiment of the present disclosure.

Referring to FIG. 7, the semiconductor integrated device 600 may be configured to include a lateral double diffused MOS (LDMOS) transistor 600A and the MOS varactor 600B. The LDMOS transistor 600A and the MOS varactor 600B may be disposed on a first and a second regions 601, 602 of a substrate 610, respectively. A P-type semiconductor region 620 may be disposed on the substrate 610. In an embodiment, the P-type semiconductor region 620 may be an epitaxial layer. Alternatively, the P-type semiconductor region 620 may be a junction region which is formed by implanting P-type impurity ions into an upper region of the substrate 610. An N-type buried layer (NBL) 612 may be disposed between the substrate 610 and the P-type semiconductor region 620. The N-type buried layer 612 may be disposed on the first region 601 of the substrate 610. For example, the N-type buried layer 612 may be not disposed on the second region 602 of the substrate 610 but disposed on the first region 601 of the substrate 610. The N-type buried layer 612 may be formed by diffusing impurity ions implanted into an interfacial region between the substrate 610 and the P-type semiconductor region 620 at a relatively high dose.

An N-type deep well region (DNW) 631 may be disposed in a portion of the P-type semiconductor region 620 located on the first region 601 of the substrate 610. The N-type deep well region 631 may extend from a top surface of the P-type semiconductor region 620 toward the substrate 610 to contact the N-type buried layer 612. A first N-type well region (NW1) 632 may be disposed in an upper region of the N-type deep well region 631. An N-type contact region 633 may be disposed in an upper region of the first N-type well region 632. The N-type contact region 633 may be electrically connected to a well bias terminal NWB. A bias applied to the well bias terminal NWB may be transmitted to the N-type buried layer 612 through the N-type contact region 633, the first N-type well region 632 and the N-type deep well region 631. A first P-type well region (PW1) 634 may be disposed in an upper region of the P-type semiconductor region 620. The first P-type well region 634 may be disposed to be spaced apart from the first N-type well region 632 and the N-type deep well region 631 by a predetermined distance. A trench isolation layer 680 may be disposed between the first P-type well region 634 and the first N-type well region 632. A first P-type contact region 635 may be disposed in an upper region of the first P-type well region 634. The first P-type contact region 635 may be electrically connected to a well bias terminal PWB. A bias applied to the well bias terminal PWB may be transmitted to the P-type semiconductor region 620 through the first P-type contact region 635 and the first P-type well region 634.

A second P-type well region (PW2) 636 and an N-type drift region 637 may be disposed in an upper region of the P-type semiconductor region 620 to be spaced apart from each other by a first channel region 638. An N-type source region 641 and a second P-type contact region 642 may be disposed in an upper region of the second P-type well region 636. The N-type source region 641 may be disposed to be spaced apart from the first channel region 638 by a second channel region 639. A sidewall of the N-type source region 641 may be in contact with a sidewall of the second P-type contact region 642. The N-type source region 641 and the second P-type contact region 642 may be electrically connected to a source terminal S. A bias applied to the source terminal S, for example, a ground voltage may be supplied to the N-type source region 641 as well as the second P-type well region 636 through the second P-type contact region 642. The N-type drift region 637 may include a first N-type drift region 637a and a second N-type drift region 637b. A sidewall of the second N-type drift region 637b may be in contact with the first channel region 638, and another sidewall of the second N-type drift region 637b opposite to the first channel region 638 may be in contact with a sidewall of the first N-type drift region 637a. The trench isolation layer 680 may extend to be located between the first N-type drift region 637a and the first P-type well region 634. In an embodiment, an impurity concentration of the first N-type drift region 637a may be higher than an impurity concentration of the second N-type drift region 637b. An N-type drain region 643 may be disposed in an upper region of the first N-type drift region 637a. The N-type drain region 643 may be electrically connected to a drain terminal D. a bias applied to the drain terminal D, for example, a drain voltage may be supplied to the N-type drain region 643.

A first gate insulation layer 651 may be disposed on the first and second channel regions 638 and 639 and the second N-type drift region 637b. In an embodiment, the first gate insulation layer 651 may include an oxide layer. A first gate electrode 661 may be disposed on the first gate insulation layer 651. In an embodiment, the first gate electrode 661 may include a doped polysilicon layer. First gate spacers 671 may be disposed on both sidewalls of the first gate electrode 661, respectively. In an embodiment, each of the first gate spacers 671 may include a nitride layer. The first gate electrode 661 may be electrically connected to a first gate terminal G1. If a gate voltage over a certain positive voltage is applied to the first gate electrode 661 through the first gate terminal G1, a channel inversion layer may be formed in the first and second channel regions 638 and 639 forming a current path between the drain and source terminals D, S.

A second N-type well region (NW2) 644 may be disposed in an upper region of the P-type semiconductor region 620 on the second region 602 of the substrate 610. The trench isolation layer 680 may extend between the second N-type well region 644 and the first N-type well region 632. A first and a second N-type junction regions 645 and 646 may be disposed in an upper region of the second N-type well region 644 and spaced apart from each other by a channel region 647. The first and second N-type junction regions 645 and 646 may be electrically connected to a bulk terminal B. A second gate insulation layer 652 may be disposed on the channel region 647. In an embodiment, the second gate insulation layer 652 may include an oxide layer. A second gate electrode 662 may be disposed on the gate insulation layer 652. In an embodiment, the second gate electrode 662 may include a polysilicon layer doped with N-type impurities. Second gate spacers 672 may be disposed on both sidewalls of the second gate electrode 662, respectively. In an embodiment, each of the second gate spacers 672 may include a nitride layer. The second gate electrode 662 may be electrically connected to a second gate terminal G2.

The second N-type well region 644 constituting the MOS varactor 600B included in the semiconductor integrated device 600 may have a similar concentration profile to the curve 210 illustrated in FIG. 2. For example, the second N-type well region 644 may exhibit a maximum impurity concentration in the channel region 647, and an impurity concentration of the second N-type well region 644 may gradually decrease from the channel region 647 toward the P-type semiconductor region 620. Accordingly, as described with reference to FIG. 5, the tuning range of the MOS varactor 600B may be less than the tuning range of the general MOS varactor. The second N-type well region 644 may be formed using an implantation process a plurality of times. For example, the second N-type well region 644 may be formed using a first implantation process for forming the first N-type drift region 637a, a second implantation process for forming the second N-type drift region 637b, and a third implantation process for forming the first N-type well region 632.

Figure 8:
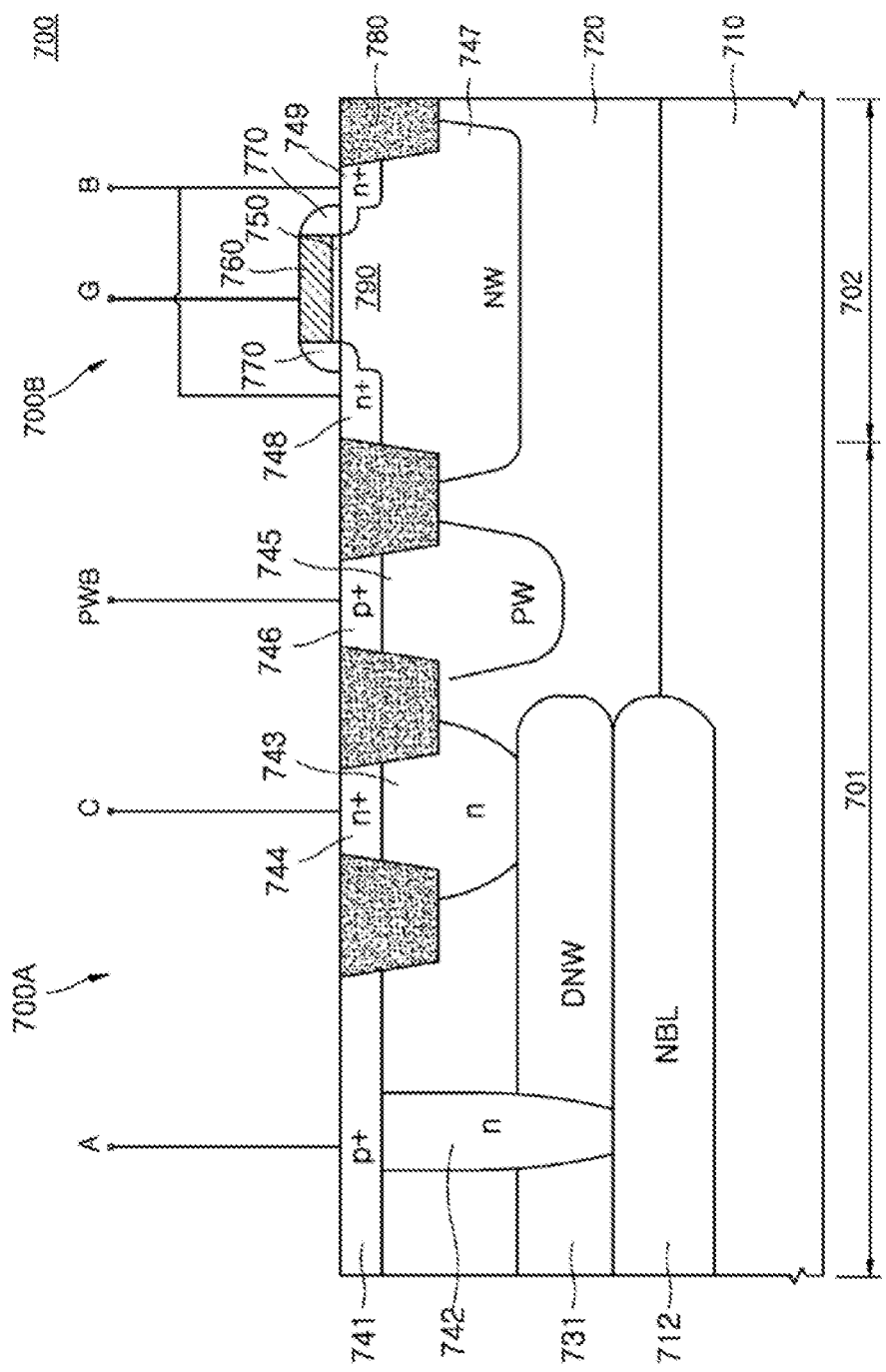
FIG. 8 is a cross-sectional view illustrating a semiconductor integrated device including a MOS varactor, according to another embodiment of the present disclosure.

FIG. 8 is a cross-sectional view illustrating a semiconductor integrated device 700 including a MOS varactor 700B, according to another embodiment of the present disclosure.

Referring to FIG. 8, the semiconductor integrated device 700 may be configured to include a zener diode 700A and the MOS varactor 700B. The zener diode 700A and the MOS varactor 700B may be disposed on a first and a second regions 701, 702 of a substrate 710, respectively. A P-type semiconductor region 720 may be disposed on the substrate 710. In an embodiment, the P-type semiconductor region 720 may be an epitaxial layer. Alternatively, the P-type semiconductor region 720 may be a junction region which is formed by implanting P-type impurity ions into an upper region of the substrate 710. An N-type buried layer (NBL) 712 may be disposed between the substrate 710 and the P-type semiconductor region 720. The N-type buried layer 712 may be disposed not on the second region 702 but on the first region 701 of the substrate 710. The N-type buried layer 712 may be formed by diffusing impurity ions implanted into an interfacial region between the substrate 710 and the P-type semiconductor region 720 at a relatively high dose. An N-type deep well region DNW 731 may be disposed on the N-type buried layer 712. A bottom surface of the N-type deep well region 731 may be in contact with a top surface of the N-type buried layer 712.

A first P-type contact region 741 may be disposed in an upper region of the P-type semiconductor region 720 on the first region 701 of the substrate 710. The first P-type contact region 741 may be electrically connected to an anode terminal A of the zener diode 700A. An N-type sink region 742 may be disposed between the first P-type contact region 741 and the N-type deep well region 731. A top surface and a bottom surface of the N-type sink region 742 may be in contact with a bottom surface of the first P-type contact region 741 and a top surface of the N-type buried layer 712, respectively. Sidewalls of the N-type sink region 742 may be in contact with the N-type deep well region 731. An N-type junction region 743 may be disposed in an upper region of the P-type semiconductor region 720. A bottom surface of the N-type junction region 743 may be in contact with a top surface of the N-type deep well region 731. An N-type contact region 744 may be disposed in an upper region of the N-type junction region 743. The trench isolation layer 780 may extend between the N-type contact region 744 and the first P-type contact region 741. The N-type contact region 744 may be electrically connected to a cathode terminal C of the zener diode 700A. A PN junction structure may be provided between the anode terminal A and the cathode terminal C. If a reverse bias is applied to the PN junction structure, only a leakage current may flow through the PN junction structure before a breakdown phenomenon occurs. However, if a reverse bias over a zener breakdown voltage is applied to the PN junction structure, a large current may flow from the cathode terminal C toward the anode terminal A.

A P-type well region (PW) 745 may be disposed in an upper region of the P-type semiconductor region 720. The trench isolation layer 780 may extend between the P-type well region 745 and the N-type junction region 743. A second P-type contact region 746 may be disposed in an upper region of the P-type well region 745. The second P-type contact region 746 may be electrically connected to a well bias terminal PWB. A bias applied to the well bias terminal PWB may be supplied to the P-type semiconductor region 720 through the second P-type contact region 746 and the P-type well region 745.

An N-type well region (NW) 747 may be disposed in an upper region of the P-type semiconductor region 720 on the second region 702 of the substrate 710. The trench isolation layer 780 may extend between the N-type well region 747 and the P-type well region 745. A first and a second N-type junction regions 748, 749 may be disposed in an upper region of the N-type well region 747 and spaced apart from each other by a channel region 790. The first and second N-type junction regions 748, 749 may be electrically connected to a bulk terminal B. A gate insulation layer 750 may be disposed on the channel region 790. In an embodiment, the gate insulation layer 750 may include an oxide layer. A gate electrode 760 may be disposed on the gate insulation layer 750. In an embodiment, the gate electrode 760 may include a polysilicon layer doped with N-type impurities. Gate spacers 770 may be disposed on both sidewalls of the gate electrode 760, respectively. In an embodiment, each of the gate spacers 770 may include a nitride layer. The gate electrode 760 may be electrically connected to a gate terminal G.

The N-type well region 747 constituting the MOS varactor 700B included in the semiconductor integrated device 700 may have a similar concentration profile to the curve 210 illustrated in FIG. 2. For example, the N-type well region 747 may exhibit a maximum impurity concentration in the channel region 790, and an impurity concentration of the N-type well region 747 may gradually decrease from the channel region 790 toward the P-type semiconductor region 720. Accordingly, as described with reference to FIG. 5, the tuning range of the MOS varactor 700B may be less than the tuning range of the general MOS varactor. The N-type well region 747 may be formed using a plurality of implantation process steps. For example, the N-type well region 747 may be formed using a first implantation process for forming the N-type sink region 742, a second implantation process for forming the N-type junction region 743, and a third implantation process for forming a general N-type well region 747.

The embodiments of the present disclosure have been disclosed above for illustrative purposes. Those of ordinary skill in the art will appreciate that various modifications, additions, and substitutions are possible, without departing from the scope and spirit of the present disclosure as disclosed in the accompanying claims.

What is claimed is:

1. A metal-oxide-semiconductor (MOS) varactor comprising:
   a first N-type junction region and a second N-type junction region spaced apart from each other by a channel region;
   a gate insulation layer disposed on the channel region;
   a gate electrode disposed on the gate insulation layer; and
   an N-type well region including the channel region and surrounding the first and second N-type junction regions,
   wherein the N-type well region exhibits a maximum impurity concentration in the channel region,
   wherein an impurity concentration of the N-type well region gradually decreases from the channel region toward a bottom surface of the N-type well region.

2. The MOS varactor of claim 1,
   wherein the gate electrode is electrically connected to a gate terminal; and
   wherein the first and second N-type junction regions are electrically connected to a bulk terminal.

3. The MOS varactor of claim 1, wherein the gate electrode includes a polysilicon layer doped with N-type impurities.

* * * * *